US010717646B2

(12) United States Patent
Sreenivasan et al.

(10) Patent No.: US 10,717,646 B2
(45) Date of Patent: Jul. 21, 2020

(54) PRECISION ALIGNMENT OF THE SUBSTRATE COORDINATE SYSTEM RELATIVE TO THE INKJET COORDINATE SYSTEM

(71) Applicant: Board of Regents, The University of Texas System, Austin, TX (US)

(72) Inventors: Sidlgata V. Sreenivasan, Austin, TX (US); Shrawan Singhal, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 351 days.

(21) Appl. No.: 15/600,070

(22) Filed: May 19, 2017

(65) Prior Publication Data

US 2017/0333940 A1    Nov. 23, 2017

Related U.S. Application Data

(60) Provisional application No. 62/339,454, filed on May 20, 2016.

(51) Int. Cl.
*B81C 1/00* (2006.01)
*B05D 5/00* (2006.01)
(Continued)

(52) U.S. Cl.
CPC .......... *B81C 1/00373* (2013.01); *B05D 5/005* (2013.01); *B05D 5/04* (2013.01);
(Continued)

(58) Field of Classification Search
CPC ...................................... B05D 5/005
(Continued)

(56) References Cited

U.S. PATENT DOCUMENTS 4,947,474 A * 8/1990 Zirm .................. G09B 5/065
348/78
8,394,282 B2  3/2013 Panga et al.
(Continued)

OTHER PUBLICATIONS

International Preliminary Report on Patentability for International Application No. PCT/US2017/033584 dated Nov. 20, 2018, pp. 1-9.
(Continued)

*Primary Examiner* — Tarifur R Chowdhury
*Assistant Examiner* — Omar H Nixon
(74) *Attorney, Agent, or Firm* — Robert A. Voigt, Jr.; Winstead PC

(57) ABSTRACT

A method and alignment system for minimizing errors in the deposition of films of tailored thickness. A first position on a stage is identified for optimal placement of a downward looking microscope (DLM) and an upward looking microscope (ULM) when alignment marks on the DLM and ULM are aligned, where the DLM is attached to a bridge and the ULM is attached to the stage. A second position on the stage is identified when the ULM on the stage is aligned with the alignment marks on a metrology tool. A surface of a chucked substrate affixed to the stage is then measured. A map between a substrate coordinate system and a metrology coordinate system may then be obtained using the measured surface of the chucked substrate with the first and second positions.

13 Claims, 7 Drawing Sheets

(51) Int. Cl.
    *B05D 5/04*    (2006.01)
    *B41J 2/01*    (2006.01)
    *G01B 11/00*   (2006.01)
    *G01B 11/24*   (2006.01)
    *G02B 21/00*   (2006.01)

(52) U.S. Cl.
    CPC .............. *B41J 2/01* (2013.01); *G01B 11/002* (2013.01); *G01B 11/2441* (2013.01); *G02B 21/0016* (2013.01)

(58) Field of Classification Search
    USPC ........................................................ 356/401
    See application file for complete search history.

(56) References Cited

U.S. PATENT DOCUMENTS

| | | | |
|---|---|---|---|
| 9,415,418 B2 | 8/2016 | Sreenivasan et al. | |
| 2003/0041656 A1 | 3/2003 | Neo et al. | |
| 2004/0150814 A1 | 8/2004 | Yamamoto et al. | |
| 2006/0078807 A1* | 4/2006 | Chen | B82Y 10/00 430/22 |
| 2008/0293344 A1* | 11/2008 | Ettinger | B24B 1/002 451/527 |
| 2009/0185184 A1* | 7/2009 | Inaoka | B41J 2/145 356/401 |
| 2009/0251699 A1* | 10/2009 | George | H01L 21/681 356/401 |
| 2013/0226334 A1* | 8/2013 | Okamoto | H01L 21/67253 700/225 |
| 2013/0235180 A1* | 9/2013 | Rogers | G02B 21/0056 348/79 |
| 2014/0230727 A1 | 8/2014 | Suriawidjaja et al. | |
| 2014/0314897 A1 | 10/2014 | Ahn et al. | |
| 2015/0048050 A1 | 2/2015 | Sreenivasan et al. | |
| 2015/0360400 A1* | 12/2015 | Tsurumi | G03F 7/0002 264/40.1 |
| 2016/0318066 A1 | 11/2016 | Sreenivasan et al. | |
| 2017/0106399 A1 | 4/2017 | Sreenivasan et al. | |

OTHER PUBLICATIONS

International Search Report and Written Opinion of the International Searching Authority for International Application No. PCT/US2017/033584 dated Oct. 2, 2017, pp. 1-13.
Stafford et al., "Generating Thickness Gradients of Thin Polymer Films via Flow Coating," Review of Scientific Instruments, vol. 77, No. 023908, 2006, pp. 1-7.
Ratcliff et al., "Directed Electrodeposition of Polymer Films Using Spatially Controllable Electric Field Gradients," Langmuir, vol. 23, 2007, pp. 9905-9910.
Liu et al., "Synthesis of High-Density Grafted Polymer Layers with Thickness and Grafting Density Gradients," Langmuir, vol. 21, 2005, pp. 11806-11813.
Handa et al., "Highly Accurate Differential Deposition for X-ray Reflective Optics," Surface and Interface Analysis, vol. 40, Mar. 12, 2008, pp. 1019-1022.
S.S. Zakariyah, "Laser Ablation for Polymer Waveguide Fabrication," Chapter 6 of Micromachining Techniques for Fabrication of Micro and Nano Structures, Loughborough University, 2012, pp. 109-130.
Brian Derby, "Inkjet Printing of Functional and Structural Materials: Fluid Property Requirements, Feature Stability, and Resolution," Annual Review of Materials Research, vol. 40, 2010, pp. 395-414.
Bailey et al., "Step and Flash Imprint Lithography: Template Surface Treatment and Defect Analysis,"Journal of Vacuum Science and Technology B, vol. 18, No. 6, Nov./Dec. 2000, pp. 3572-3577.

* cited by examiner

GIVEN SURFACE

NOMINAL SHAPE, h = 0-10 mm, L > 20 mm

+

NANOTOPOGRAPHY, h = 0.1-1 μm, L = 0.2-20 mm

+

ROUGHNESS, h = 1-10 nm, L << 0.2 mm (~10 μm)

PRECISION ALIGNMENT OF THE SUBSTRATE COORDINATE SYSTEM RELATIVE TO THE INKJET COORDINATE SYSTEM

GOVERNMENT INTERESTS

This invention was made with government support under Grant No. ECCS1120823 awarded by the National Science Foundation. The U.S. government has certain rights in the invention.

TECHNICAL FIELD

The present invention relates generally to unwanted parasitic signatures due to mismatch in coordinate frames, and more particularly to establishing precision alignment of the substrate coordinate system relative to the inkjet coordinate system.

BACKGROUND

A process, such as the Programmable Adaptive Inkjetting of Nanoscale Thin-Films (PAINT) process, is utilized for depositing films of tailored thickness at near-zero material wastage. PAINT is substantially agnostic towards the choice of substrate type, thickness or material and is capable of depositing films over large areas. By design, PAINT can also substantially decouple the influence of systematic parasitics, such as surface topography, inkjet drop volume variation, etc., and prevent them from corrupting the final film thickness.

However, in such a process, when the surface of the substrate is of primary importance, such as in planarization, surface profile metrology is needed to obtain a map of nominal and parasitic topography on the substrate. The surface profile metrology needs to measure the topography of the final surface closest to the "superstrate" (utilized for urging liquid organic material drops that were dispensed by an inkjet to merge laterally across the substrate) just prior to the execution of the PAINT process.

Any mismatch in coordinate frames between the substrate and the reference surface, and subsequently between the substrate and the superstrate, or the substrate and the inkjet may result in unwanted parasitic signatures. This overall alignment typically ensures that the drop deposition and any subsequent PAINT are performed on the correct locations. Tolerable errors in alignment depend on the nature of the substrate nominal figure and the amount of correction desired in a single PAINT step. Typically these errors may need to be <100 µm, <50 µm, <10 µm or <1 µm.

As a result, it becomes necessary to establish proper alignment, especially of the substrate coordinate system relative to the inkjet coordinate system. The location and orientation of all coordinate systems, i.e., substrate coordinate system, metrology coordinate system and the inkjet coordinate system, need to be known with micron-scale precision (depends on application and may need to be <100 µm, <50 µm, <10 µm or <1 µm) relative to the global stage coordinate system. It is important to minimize the introduction of parasitic topography errors coming from misalignment between the actual substrate topography and the topography that is corrected by the inkjet.

Currently though, no techniques exist for minimizing the introduction of such parasitic topography errors.

SUMMARY

In one embodiment of the present invention, a method for depositing tailored thin films to compensate for undesirable surface topography of a substrate comprises precisely locating a metrology tool with respect to a fixed bridge, where the fixed bridge is supporting an inkjet and a superstrate chuck. The method further comprises precisely locating the substrate with respect to the metrology tool. The method additionally comprises precisely locating the inkjet with respect to the bridge. Furthermore, the method comprises measuring a substrate topography on the metrology tool. Additionally, the method comprises mapping, by a processor, the measured substrate topography in a metrology tool coordinate system to a coordinate system attached to the inkjet supported by the bridge. In addition, the method comprises identifying a desired film thickness needed to compensate for the undesirable surface topography of the substrate. The method further comprises obtaining optimal inkjet drop locations and volumes based on the map of the substrate topography and the desired film thickness. The method additionally comprises executing a Programmable Adaptive Inkjetting of Nanoscale Thin-Films (PAINT) process to achieve the desired film thickness needed to compensate for the undesirable surface topography of the substrate.

Other forms of the embodiment of the method described above are in a system and in a computer program product.

In another embodiment of the present invention, an alignment system comprises a plate with alignment marks attached to a metrology tool. The alignment system further comprises a bridge having an inkjet, a downward looking microscope and a superstrate chuck affixed to the bridge, where a superstrate is affixed to the superstrate chuck. The alignment system additionally comprises a stage fitted with an upward looking microscope. Furthermore, the alignment system comprises a substrate with an identifiable feature is chucked and mounted on the stage.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

The present invention presents a versatile process for two kinds of precision surface topography optimization on a nominally planar substrate—polishing and planarization. Concerning polishing, this involves any desired correction of low-, mid- or high-spatial frequency parasitics of the actual surface from a desired value, where the frequency characteristics are described further below. Concerning planarization, this involves obtaining a planar-top film, in some cases conforming to the low- and mid-spatial frequency substrate topography, while planarizing the high-spatial frequency features.

The above family of processes is referred to herein as Programmable Adaptive Inkjetting of Nanoscale Thin-Films (PAINT). The present invention leverages and significantly enhances the PAINT method previously utilized.

Figure 1:
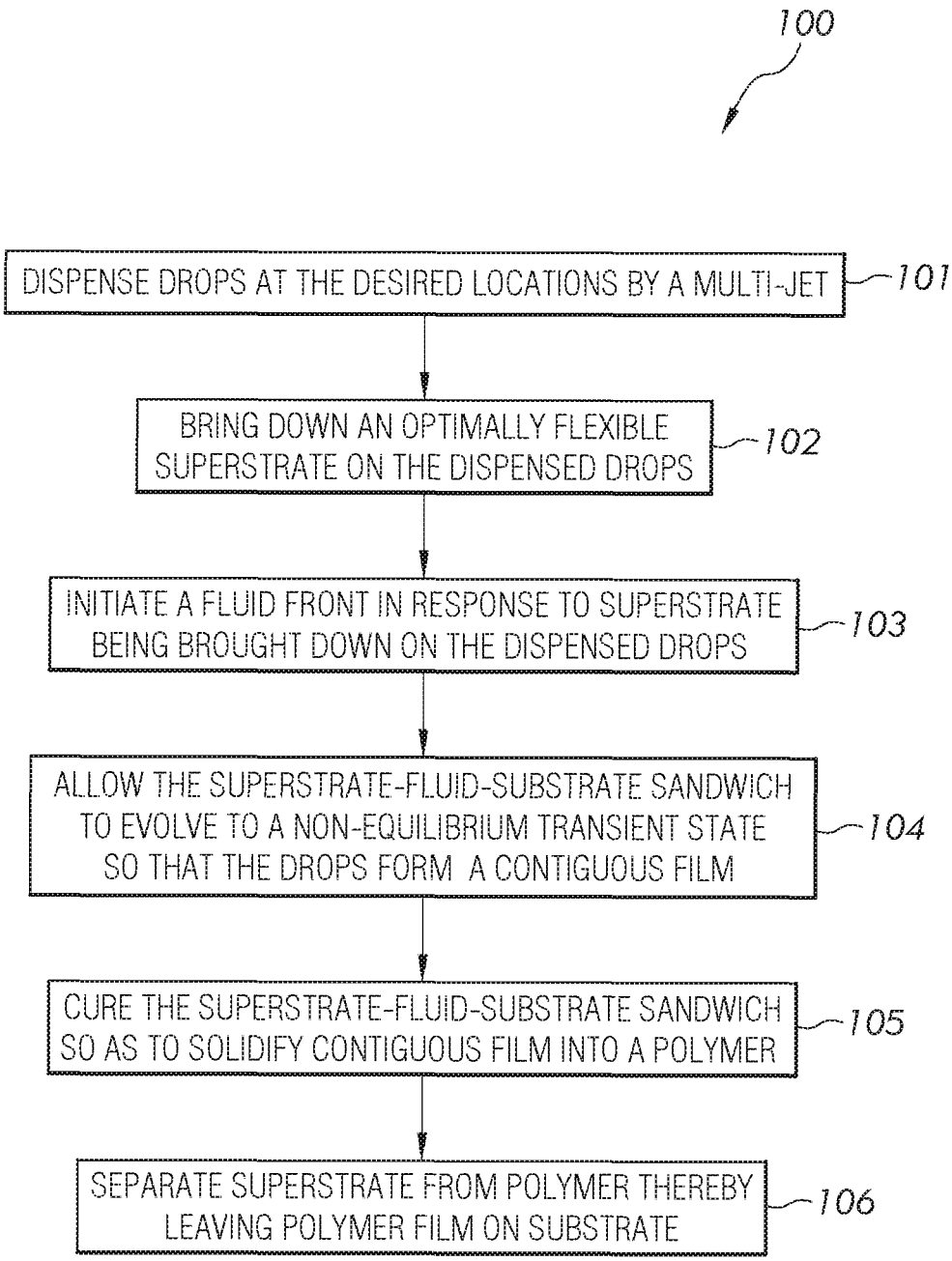
FIG. 1 is a flowchart of a method for depositing films with prescribed thickness variation using Programmable Adaptive Inkjetting of Nanoscale Thin-Films (PAINT) in accordance with an embodiment of the present invention.

A method for prescribed film thickness variation using PAINT is discussed below in connection with FIGS. 1 and 2. FIG. 1 is a flowchart of a method 100 for depositing films with prescribed thickness variation using PAINT in accordance with an embodiment of the present invention. FIG. 1 will be discussed in conjunction with FIGS. 2A-2F, which depict the cross-sectional views of depositing a thin film on a substrate during the fabrication steps described in FIG. 1 in accordance with an embodiment of the present invention.

As discussed herein, the "superstrate" needs to possess "optimal flexibility" wherein its stiffness is: (1) high enough to allow urging of the liquid organic material drops to merge laterally rather than trapping individual drops as islands with the superstrate wrapped around them; and (2) low enough that the strain energy stored in the superstrate due to its deformation does not significantly impact the thin film fluid dynamic behavior prior to curing or crosslinking of the monomer. This characteristic may also enable the superstrate to be selectively insensitive to low- and sometimes mid-spatial frequency topography features on the substrate.

Figure 2A:
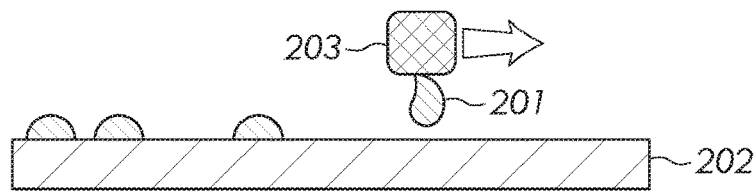
FIGS. 2A-2F depict the cross-sectional views of depositing a thin film on a substrate during the fabrication steps described in FIG. 1 in accordance with an embodiment of the present invention.

Referring to FIG. 1, in conjunction with FIGS. 2A-2F, in step 101, drops 201 of a material are dispensed at the desired locations on a substrate 202 by a multi jet 203 as illustrated in FIG. 2A. Multi-jet 203 is represented by a single jet as a multi-jet array extends into the plane of FIG. 2A. The desired locations of the drops are derived from an inverse optimization framework. In one embodiment, the minimum volume of drops 201 dispensed is below 5 picoliters using either piezo jets or electro hydro dynamic jets. In another embodiment, the minimum volume of drops 201 dispensed is below 1 picoliter using either piezo jets or electro hydro dynamic jets. In one embodiment, substrate 202 is composed of a material with a Young's modulus greater than 1 GPa. In one embodiment, substrate 202 is a rigid wafer composed of one or more of the following materials: silicon, silicon dioxide and gallium nitride.

Figure 2B:
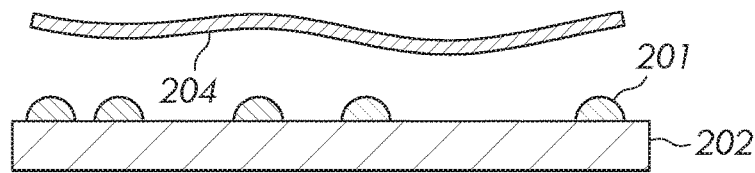

In step 102, an optimally flexible superstrate 204 is brought down on the dispensed drops 201 as illustrated in FIG. 2B.

Figure 2C:
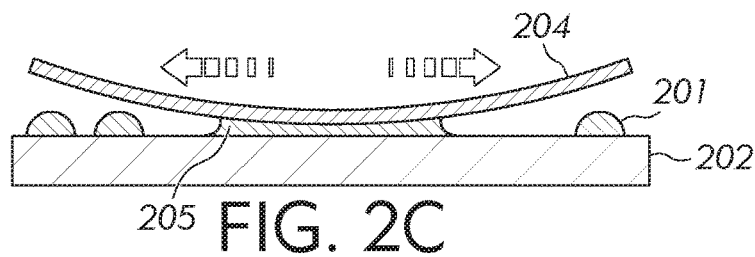

In step 103, a fluid front 205 is then initiated in response to superstrate 204 being brought down on the dispensed drops 201 as illustrated in FIG. 2C. The shape of superstrate 204 and the speed at which it comes down may be chosen to allow drops 201 to merge laterally to minimize any trapping of air bubbles to form a contiguous film. A local atmosphere of gases, such as $CO_2$, that is soluble in organic liquids or He that readily diffuses into most substrates 202 and/or superstrate 204 may be used in the substrate-superstrate sandwich region to further assist in avoiding trapping of bubbles in this process. The material of superstrate 204 can include a number of choices including, but not limited to, glass (e.g., quartz, fused silica, etc.), plastics (e.g., PMMA, polycarbonate, PET, PEN, etc.) or ceramics (e.g., Zerodur®), including ceramics with a thin film of a polymer. Plastic and ceramic materials have inherent porosity which further aids in the transmission of gases and avoids the trapping of bubbles. Superstrate 204 is typically polished to be locally smooth, i.e., possess low surface roughness (roughness is defined as amplitude variations across micron-scale spatial wavelengths). The surface of superstrate 204 may be coated with a low surface energy coating, such as FOTS or Teflon, while the surface of substrate 202 may be coated with an adhesion promoter, such as BARC, ValMat, or TranSpin. The use of superstrate and/or substrate coating will enhance the ability to leave the cured material onto substrate 202 at the end of this process. The inkjetted material can include UV-curable materials, such as Mono-Mat® and SilMat® materials offered by Molecular Imprints, Inc. or the mr-UVcur** offered by Micro-resist technologies.

Figure 2D:

In step 104, the superstrate-fluid-substrate sandwich is allowed to evolve to a non-equilibrium transient state after a duration of time so that drops 201 form a contiguous film 206 with a superstrate layer 204 on top of the contiguous film 206 as illustrated in FIG. 2D.

Figure 2E:
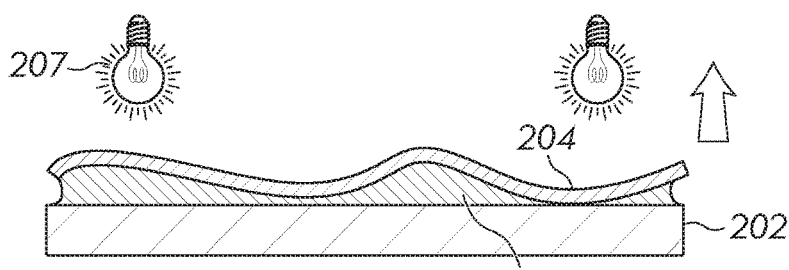

In step 105, the superstrate-fluid-substrate sandwich is cured from UV exposure 207 so as to crosslink contiguous film 206 into a polymer as illustrated in FIG. 2E.

Figure 2F:
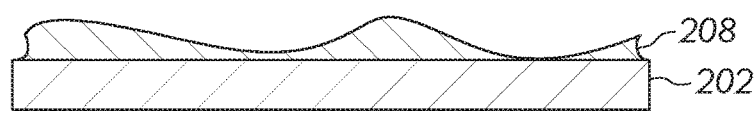

In step 106, superstrate 204 is separated from the polymer thereby leaving a polymer film 208 on substrate 202 as illustrated in FIG. 2F. Substrate 202 is assumed to have the topography which needs to be polished or planarized, while superstrate 204 is essentially a vehicle for achieving the PAINT process. In one embodiment, polymer film 208 may be etched to allow a transfer of a film thickness profile to an underlying functional film or substrate 202 as discussed further below.

In some implementations, method 100 may include other and/or additional steps that, for clarity, are not depicted. Furthermore, in some implementations, method 100 may be executed in a different order than presented. Additionally, in some implementations, certain steps in method 100 may be executed in a substantially simultaneous manner or may be omitted.

The PAINT process discussed above possesses the following additional advantages. Such a process enables user-defined tailored film thickness profiles with nanometer scale accuracy at high process speeds. Most manufacturing processes that provide customization suffer from low process speeds, therefore cost-effective customization often remains elusive. In PAINT, the use of programmable inkjets in combination with optimal superstrates allows for both customization and high-speed (and therefore potential for low-cost processing).

Furthermore, such a process enables a very low consumable cost by having near-zero or low material wastage. Low consumable cost along with low capital cost (due to high-speed processing) makes PAINT a potentially cost-effective process for a variety of applications.

Additionally, the combination of enabling performance and customizability based on software and low cost has the potential to have significant advantages in the domain of correction of surface topography in the area of semiconductor planarization. This also encompasses any desired correction of low-, mid- and high-spatial frequency parasitics of the actual surface from a desired value without introducing additional parasitics at different length scales. Hence, this method inherently allows for surface "polishing" as well without the need for additional soft- or hard-lapping and polishing tools or ultra-precise pre-formed molds. Often, planarization, polishing and correction of undesirable parasitics can be achieved simultaneously, something which other processes in the same category find difficult to achieve.

PAINT is also substantially insensitive to the choice of substrate type, thickness or material and is capable of depositing films over large areas. By design, it can also substantially decouple the influence of systematic parasitics, such as surface topography, systematic inkjet drop volume changes, etc., and prevent them from corrupting the final film thickness.

Given that the process relies on material deposition to form a thin film, it is instructive to know how such thin film deposition is carried out in the industry today. Fabrication of most micro- and nano-devices including semiconductors, photonic and optoelectronic devices, microelectromechanical systems/nanoelectromechanical systems (MEMS/ NEMS), electronic displays (such as Liquid Crystal Displays (LCDs)), etc. requires the deposition of many thin films. Several deposition options exist in the industry today. Deposition in the liquid phase is typically carried out by processes like spin-coating, which is often used as a precursor to subsequent reactions that solidify the liquid to obtain the desired thin film. In the vapor phase, the most commonly used technique is that of Chemical Vapor Deposition (CVD). In a typical CVD process, the substrate is exposed to precursors in the gaseous phase that react or decompose to form the desired film on the surface of the substrate. There are several types of CVD processes. Depending upon the pressure used, they can be classified as Atmospheric Pressure CVD (APCVD), Low Pressure CVD (LPCVD) or Ultrahigh Vacuum CVD (UHVCVD). Low pressures tend to reduce unwanted reactions and improve film thickness uniformity. Plasma based methods to enhance the chemical reactions, like Plasma Enhanced CVD (PECVD) and Remote PECVD are also used in the deposition of thin films in the semiconductor industry to lower deposition temperatures and protect the substrate from high-temperature effects. A technique called Atomic Layer Deposition (ALD) is also frequently used to produce conformal monolayers of one or different materials. Physical Vapor Deposition (PVD) methods too are important thin film deposition techniques. As the name suggests, they do not rely on chemical reactions, but deposit condensed forms of a vaporized material onto the substrate in a vacuum environment. Evaporative deposition and sputtering are two common examples of PVD. The former heats the material to be deposited to a high vapor pressure, while the latter utilizes a plasma discharge to bombard the substrate surface with atoms of the material to be deposited.

All the processes discussed above deposit thin films in a manner where the amount of material deposited per unit area is substantially the same. The ability to tailor materials to form intentionally non-uniform films is not typically possible for these processes, or requires frequent changes in hardware or tooling to accommodate variations in substrate geometry and desired film thickness profile. Also, processes, such as spin-coating, involve significant material wastage, while vacuum processes can be expensive due to the need to pump down chambers where processing is performed. PAINT provides unique performance and cost advantages relative to these processes.

With the need for more sustainable processes, inkjetting has also become an attractive technique for material deposition as well as inexpensive patterning due to its direct write, "maskless" nature. However, due to the presence of a substantial vapor-liquid interface in the dispensed drops, evaporation and gradients in surface tension can cause local film thickness non-uniformity leading to the infamous "coffee-ring effect." Moreover, film thickness uniformity is also influenced strongly by the volume of the individual drops, the surface properties of both, the dispensed fluid as well as the substrate, and the spacing between consecutive drops, or the drop pitch, which needs to be low enough to allow the drops to spread and merge. Hence, in spite of having remarkably low material consumption, the above factors make process control for inkjet-based deposition of large area nanoscale thickness films challenging.

Flow coating has been developed at National Institute of Standards and Technology (NIST) as a velocity-gradient knife-edge coating process. A drop of the polymer solution is deposited on the substrate which is moved at constant acceleration. The competition between friction drag as a result of the velocity gradient action of the substrate and the capillary forces due to the stationary knife-edge placed ~200 µm above the substrate during the substrate motion creates a thickness gradient of the film. Subsequent evaporation leads to the realization of sub-micron thickness films. Thin polystyrene films with range even in the sub-100 nm regime have been demonstrated using this apparatus, but it is unclear whether films in non-monotonic profiles can be obtained using the same.

A variation of electrochemical deposition has also been used, in which varying thickness poly-electrolyte films have been deposited using spatially tunable electric field gradients. In addition, variable salt etching of polyelectrolyte films where the amount of material removed is controlled spatially to realize thin film thickness gradients has also been demonstrated. However, such techniques do not have the film thickness range and resolution required to be applicable for a broad spectrum of areas.

The deposition of ultra-thin films with functional gradients is an active area of research in the biomedical domain related to studying various factors involved in tissue engineering. To this end, biomimetic films have been fabricated by a layer-by-layer (LBL) assembly process, where it is possible to impart functional gradients at a molecular level and higher to screen events, such as protein adsorption and cell adhesion. The LBL techniques mainly proceed through a combination of various surface interactions, including electrostatic forces, van-der-Waals forces, hydrogen bonds, etc. Grafting of polymer molecules on functionalized substrates with temperature gradients also results in thickness gradients.

In addition to the above mentioned methods, vapor-based techniques are also available, primarily for depositing inorganic films with varying thicknesses. These techniques mostly employ a motion-controlled mask to generate the required thickness profiles, or use a discretized shower head with control over each shower unit. Such methods have limited film thickness variations that can be achieved and often require a change in hardware to generate a variety of profiles, thus constraining their versatility across various applications.

As discussed above, PAINT uses an inkjet to dispense droplets of a pre-cursor monomer on the substrate. The substrate surface may be pre-treated to enhance the spreading of the monomer and/or for adhesion of the polymerized material. If the inkjet has multiple nozzles, the desired substrate area can be covered with the required drops in a few seconds or less with a scanning stage driving the inkjet relative to the substrate, while retaining control over the volume and location of each dispensed drop. For each desired film thickness profile, the optimum drop volumes and locations are obtained from an inverse optimization routine wrapped around a simplified or linearized thin film lubrication model. Following drop dispense, an optimally flexible superstrate that has been bowed with the help of backside pressure or gravity, is brought down such that first contact on the drops is made by the front side. This initiates a liquid front that quickly spreads outward merging with the drops and thereby creating a contiguous film. This substrate-fluid-superstrate "sandwich" is then allowed to evolve for a desired duration following which the monomer is cured by photonic or thermal energy to crosslink it into a polymer. The superstrate is then separated from the sandwich leaving the thin polymer film on the substrate.

While it has been assumed that the superstrate is located above the substrate with the process being conducted on the substrate surface, the principles of the present invention apply to such embodiments where the relative location of the two surfaces may be reversed, i.e., the substrate may be located above the superstrate. Similarly, in the inkjetting step, it may be the substrate or the superstrate on which the drops get dispensed, depending on the relative location of these surfaces. Also, in the separation step, either the superstrate or the substrate can be moved away from the other, without changing the nature of the process. While the following discusses the substrate as having the surface which needs to be "painted," the principles of the present invention are not to be limited as such and may include other surfaces that need to be "painted."

There are several key concepts (listed below), some or all of which need to be integrated to create a viable PAINT process. These aspects, along with brief descriptions, are listed below:

(1) Dynamic thin-film lubrication model with fluid-structure interaction that includes the material properties of the substrate, superstrate and the inkjetted fluid material. The desired deposition area, the surface properties at both the superstrate-fluid interface and the fluid-substrate interface, and the geometry of the substrate and superstrate including their thickness functions and the nature of surface topography on them.

(2) Model-based design of the superstrate geometry based on the properties of the substrate, inkjet and fluid material properties.

(3) Metrology of substrate and superstrate topography and its integration into the model-based solution.

(4) Linearization of the enhanced lubrication theory model that includes the topography information.

(5) Solution of the inverse optimization routine to get drop locations and volumes around the linearized model with integer constraints coming from discrete drop volumes and sometimes drop locations.

(6) Functional optimization wrapped around the above inverse process optimization to ensure that the film thickness profiles do not lead to problems with post-PAINT processing.

(7) Precision of dispensed drops with respect to desired volume and their desired locations.

(8) Use of optimally flexible combination of superstrate and substrate to enable formation of a contiguous film, while countering evaporative losses from a liquid free surface and also avoiding trapping of air pockets.

(9) Allowing the substrate-liquid-superstrate sandwich to evolve to a certain pre-defined time, prior to UV curing, as determined by the inverse optimization routine.

(10) Curing of liquid for solidification.

(11) Separation of superstrate and substrate from each other to get the desired thin film on the substrate.

The use of an appropriate superstrate and substrate combination is important. Generally, the properties of the substrate are invariant and cannot be changed to suit the process. Hence, typically, the superstrate properties can only be modified. However, in a general case, it is both the substrate and superstrate that affect the process dynamics, and thus, they have been presented as a combination, even though in practice, it may only be one of the two which is free to be modified relative to the other. This combination of superstrate and substrate needs to possess "optimal flexibility" where the stiffness is high enough to allow urging of the monomer drops to merge laterally rather than trapping individual drops as islands with the superstrate/substrate wrapped around them and low enough that the strain energy stored in the superstrate and substrate due to their deformation does not significantly impact the thin film fluid dynamic behavior prior to curing or crosslinking of the monomer. It should also be low enough to substantially mitigate the presence of any parasitic or undesirable topography signature and by being insensitive towards it.

In general, either the superstrate or the substrate, or both, may not be rigid, depending on the application. However, for the sake of elucidation of the present invention, it is assumed that the substrate is rigid and held against a chuck; whereas, the superstrate is allowed to bend and flex. The substrate may also be allowed to bend and flex without violating the basic concept behind the PAINT process.

The superstrate may have a planar surface and be composed of a material, such as glass, ceramic or polymer, with appropriate thickness to render the desired flexibility. Another embodiment may be the use of a thin flexible film attached to a more rigid backing with fabricated or naturally occurring pores (such as Anodized Aluminum Oxide (AAO)). The backing is attached to a superstrate chuck that has two vacuum zones, one, for example along an outer annulus, and one towards the inside. The control of vacuum is transferred through the porous backing to the thin film attached to it. When the superstrate is used in the spreading step, all vacuum zones are engaged thereby allowing the thin film to be attached to the rigid backing. After spreading has been achieved, the inner vacuum zone is disengaged (or even allowed to blow positive pressure) thereby allowing the thin film to be only supported by the outer vacuum zone. This helps in substantially reducing the effective superstrate thickness (and hence, the rigidity) which is desirable in the evolution and capturing of pre-equilibrium transients (discussed further below). The thickness of the thin film superstrate could be as small as 100 nm and as high as 100 µm for materials, such as polymers, glass, ceramics, etc. The porous backing can have a thickness of 100 µm to 5 mm.

Another superstrate embodiment can be realized by having varying thicknesses at different superstrate cross-sections depending on which section of the superstrate is involved in forming the sandwich with the fluid and the substrate.

Another desirable superstrate approach involves using a roll-to-roll superstrate, that is quite flexible and held in tension with an effective bending rigidity that is just high enough to ensure robust merging of drops. The tension may be reduced once the drops have merged to minimize the bending rigidity to enhance the ability to capture pre-equilibrium transients. The roll-to-roll flexible superstrate has an added benefit of allowing for quick re-loading to prevent repeated defects from particulate contamination. Because the superstrate embodiment is on a roll of plastic, it is relatively inexpensive leading to a significant reduction in process cost. This is shown in FIG. 3.

Figure 3:
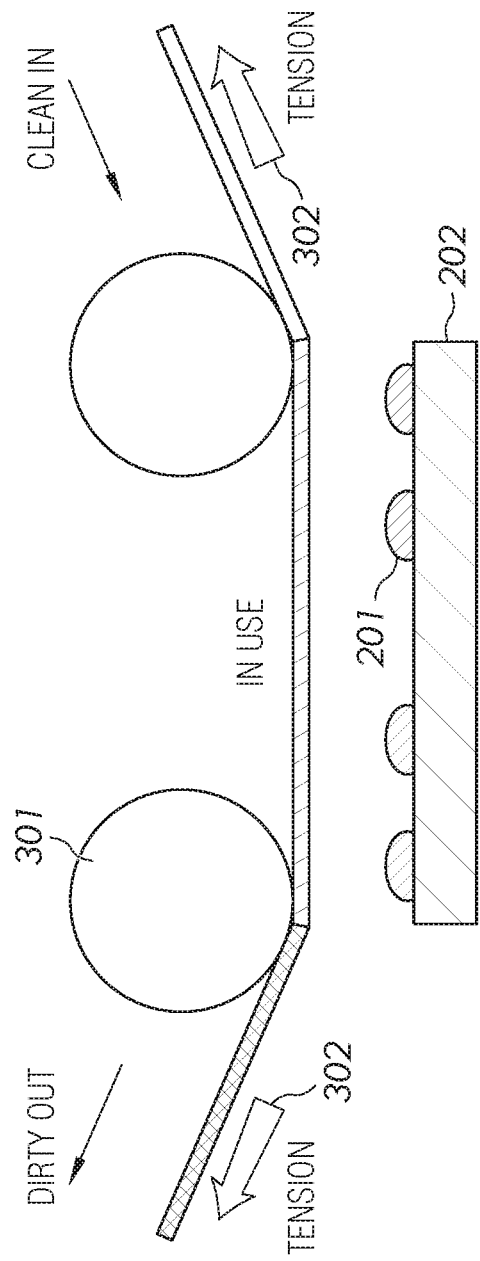
FIG. 3 illustrates a reloadable roll-roll configuration of the superstrate in accordance with an embodiment of the present invention.

FIG. 3 illustrates a reloadable roll-roll configuration of superstrate 204 in accordance with an embodiment of the present invention. Referring to FIG. 3, in conjunction with FIGS. 2A-2F, in this embodiment, superstrate 204 is a roll of plastic 301 which is held under tension (see arrows 302). Only a part of the roll 301 is used as superstrate 204. Upon repeating the PAINT process, the used part can get contaminated from particulate matter as well as process defects. Once that is identified, the rolls 301 can be rotated to bring in a cleaner superstrate area. After the entire roll is thus used, it can be discarded and a fresh roll loaded for quick process turnaround.

However, the addition of in-plane tension changes the evolution dynamics of the superstrate-fluid-substrate sandwich. In general, with a plastic superstrate thickness of 100 µm or lower, the in-plane stresses may be high thereby leading to the possibility of critical tensile or even buckling failure. Thus, while a thin superstrate is desirable to make the superstrate more flexible and have a high process time scale, it should not be so thin that it fails in tension.

Another important feature of superstrate 204 involves promoting the spreading and dissolution of outgassed material before curing, and then separation after curing. This requires superstrate 204 to have good wetting properties with the precursor liquid, and then dewetting properties with the post-cured polymer. Such properties can be obtained by coating superstrate 204 with thin films of a metal oxide or metal. The surface of superstrate 204 can also be treated.

Another step of the process is alignment which will now be discussed.

It is assumed that the topography of superstrate 204 is negligible compared to that on substrate 202. If this were not true, it would also be important to capture the topography of superstrate 204 independently and include it in the modeling framework.

In general, when only the surface of substrate 202 is of importance, such as in planarization, surface profiling is performed to obtain a map of nominal and parasitic topography on substrate 202. This map is important as it serves as an input to the inverse optimization framework for minimization of its signature. In one embodiment, the method for surface profiling is optical interferometry using a highly flat reference surface. Substrate 202 being planarized may have topography coming from polishing parasitics, or topography coming from pre-existing patterns from a prior lithography step, or a combination of the two. In the case of pre-existing patterns, additional films may be deposited (via CVD, PVD, spin coating, dip coating, slot die coating, ALD, etc.) on the patterns prior to performing the PAINT process. The surface profile metrology needs to measure the topography of the final surface closest to superstrate 204 just prior to the execution of the PAINT process.

Any mismatch in coordinate frames between substrate 202 and the reference surface, and subsequently between substrate 202 and superstrate 204, or substrate 202 and the inkjet may result in unwanted parasitic signatures. This overall alignment typically ensures that the drop deposition and any subsequent PAINT are performed on the correct locations. Tolerable errors in alignment depend on the nature of the substrate nominal figure and the amount of correction desired in a single PAINT step. Typically these errors may need to be <100 µm, <50 µm, <10 µm or <1 µm.

When the PAINT process is applied to high precision profiling applications, such as semiconductor planarization, it consists of a metrology step before the deposition step, in which the topography of substrate 202 is measured with nanoscale vertical resolution using an optical interferometer, surface profiler, or other similar instruments. In some cases, this instrument may be located in-situ, such that the topography is measured on substrate 202 as mounted (chucked), prior to performing the inkjet deposition. The mounting of substrate 202 during metrology should substantially be the same as the functional (in-use) mounting of these precision surfaces. It is desirable that the mounting introduces minimal distortions (or similar distortions) during metrology and functional use. It may be based on approaches, such as kinematic mounts, where the only distortion comes from gravitational sag, which is relatively easy to model and compensate for. This constraint of matching distortions with the metrology mounting scheme is less important during the execution of the PAINT process because as long as the distortions of substrate 202 do not cause significant changes in the local slope of substrate 202 (changes in slope being less than about 0.25 radians), the PAINT process will tolerate the distortions of substrate 202.

To this end, it becomes necessary to establish proper alignment of the substrate coordinate system relative to the inkjet coordinate system. The location (x,y) and orientation (theta) of all coordinate systems, i.e., substrate coordinate system (SCS), metrology coordinate system (MCS) and the inkjet coordinate system (ICS) need to be known with micron-scale precision (depends on application and may need to be <100 µm, <50 µm, <10 µm or <1 µm) relative to the global stage coordinate system (GSCS). It is important to minimize the introduction of parasitic topography errors coming from misalignment between the actual substrate topography and the topography that is corrected by the inkjet. Such a strategy for minimizing such parasitic topography errors is discussed below using an in-situ alignment system of FIG. 4.

Figure 4:
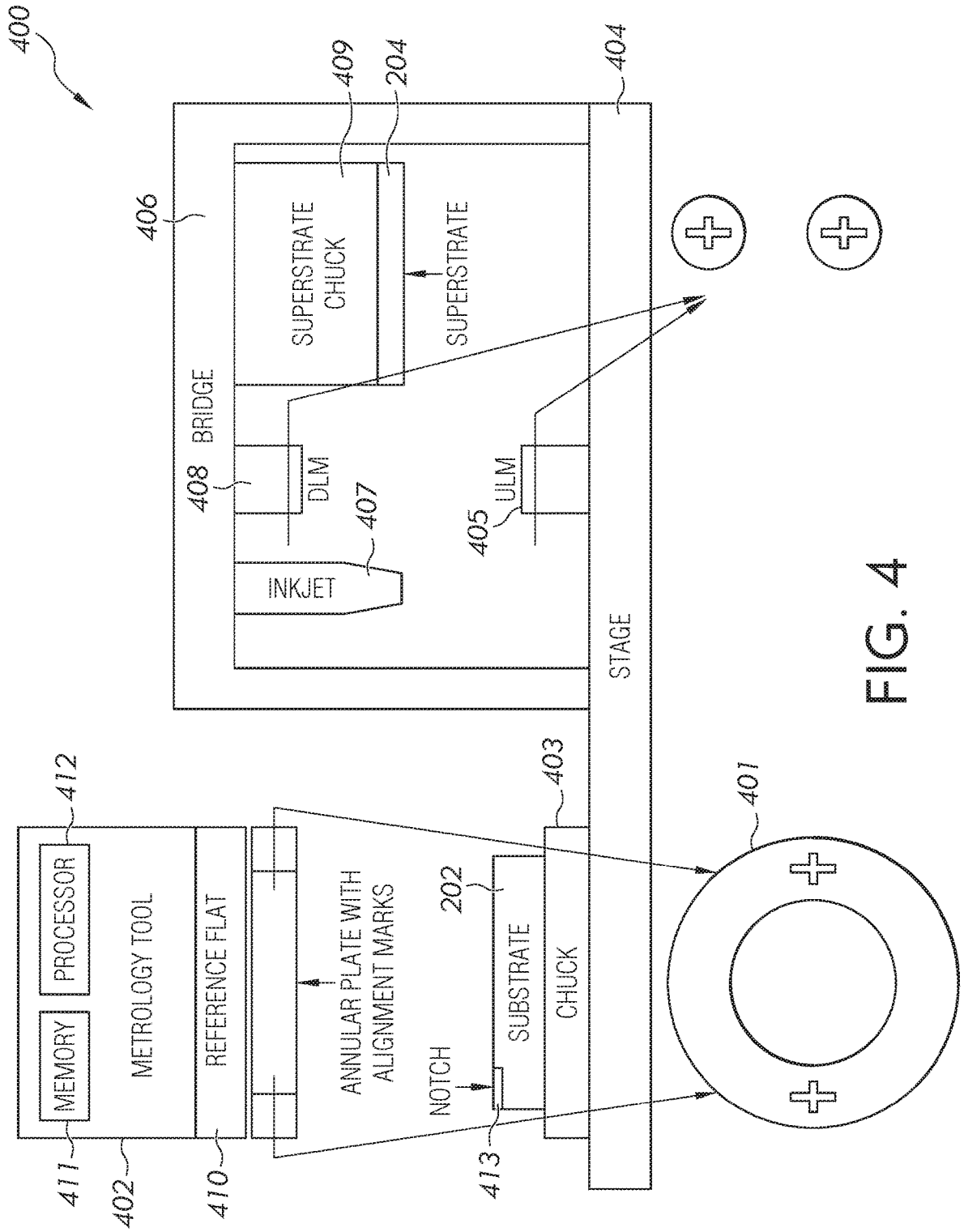
FIG. 4 illustrates an in-situ alignment system for minimizing parasitic topography errors in accordance with an embodiment of the present invention.

FIG. 4 illustrates an in-situ alignment system 400 for minimizing parasitic topography errors in accordance with an embodiment of the present invention.

Referring to FIG. 4, annular plate 401 with alignment marks (see "+" in FIG. 4) is affixed to a metrology tool 402. FIG. 4 further shows a plan view to demonstrate that the alignment marks may be offset across different areas of plate 401 to get good orientation (theta) calibration. Substrate 202 with a notch 413 or other identifiable feature is chucked 403 and mounted on an x-y-theta stage 404 fitted with an upward looking microscope (ULM) 405. A bridge 406 has the inkjet 407, a downward looking microscope (DLM) 408 and a superstrate chuck 409 with superstrate 204 affixed to it. Similar plan views of ULM 405 and DLM 408 are shown to depict that they are in a dual configuration for enabling orientation calibration and correction. In one embodiment, stage 404 may include two separate stages, where one of the stages is used for moving substrate 202 to superstrate chuck 409 and the other stage is used for moving substrate 202 to metrology tool 402.

A process for minimizing parasitic topography errors using in-situ alignment system 400 is discussed below in connection with FIG. 5.

Figure 5:
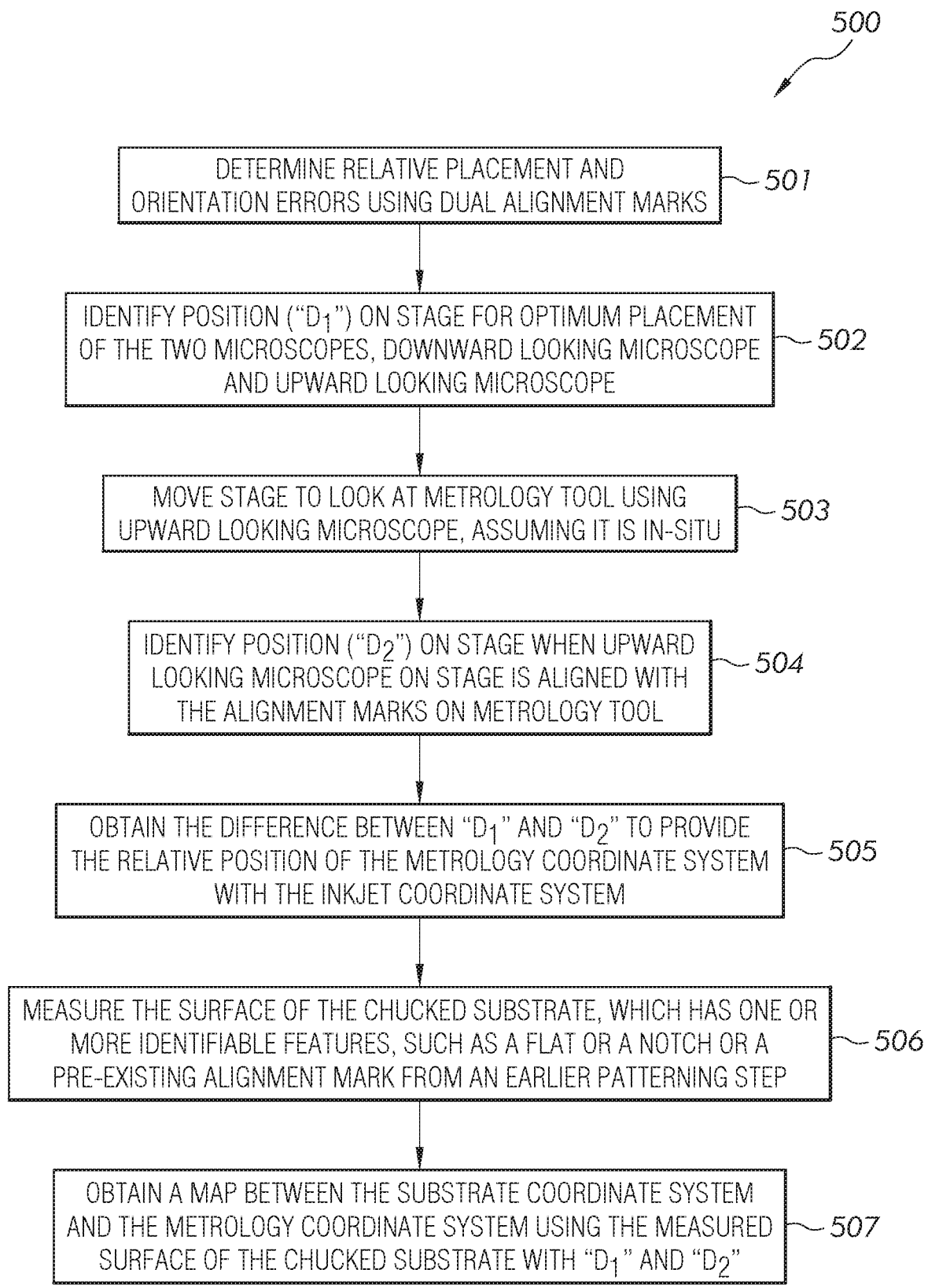
FIG. 5 is a flowchart of a method for minimizing parasitic topography errors using the in-situ alignment system of FIG. 4 in accordance with an embodiment of the present invention.

FIG. 5 is a flowchart of a method 500 for minimizing parasitic topography errors using in-situ alignment system 400 in accordance with an embodiment of the present invention.

Referring to FIG. 5, in conjunction with FIG. 4, in step 501, relative placement and orientation errors are determined using dual alignment marks on DLM 408 and ULM 405 (such as box-in-box and/or cross-in-cross type features). In particular, such errors are discovered by using DLM 408 that is affixed to the same bridge 406 as inkjet 407 and the superstrate chuck 204 to look at ULM 405 that is attached to stage 404. The size of these features, the distance between the dual marks, and the X-Y-theta stage precision determines the level of positioning accuracy that can be achieved.

In step 502, the position ("$d_1$") on stage 404 for the optimum placement (after correction) of the two microscopes is identified, such as by the stage location sensor (e.g., encoder), when the dual alignment marks are aligned, where the position "$d_1$" includes x, y and theta positions.

Subsequently, in step 503, stage 404 is then moved to look at metrology tool 402 using ULM 405, assuming it is in-situ. In one embodiment, metrology tool 402 is modified and retro-fitted with an annular surface that is in a fixed relative location with the reference surface 410 as shown in FIG. 4, with annulus 401 having alignment marks similar to the DLM/ULM 408/405.

In step 504, again, optimum stage placement and orientation is achieved after correction and noted when ULM 405 on stage 404 is aligned with the alignment marks on metrology tool 402 (alignment marks of annular plate 401 affixed to metrology tool 402). This stage position is noted as "$d_2$" (x, y, theta positions). In other words, the position ("$d_2$") on stage 404 is identified when ULM 405 is aligned with the alignment marks on metrology tool 402 (aligned with alignment marks of annular plate 401).

In step 505, the difference between "$d_1$" and "$d_2$" is obtained to provide the relative position of the metrology coordinate system with the inkjet coordinate system.

After this, the surface of the chucked substrate 202, which typically has one or more identifiable features, such as a flat or a notch 413 or a pre-existing alignment mark from an earlier patterning step, is measured on metrology tool 402 in step 506. The lateral precision of metrology tool 402 may be similar to that of the microscopes. If that is not accurate enough, DLM 408 can be used to precisely locate notch 413 and know the substrate coordinate system with respect to the inkjet coordinate system. Then, with knowledge of the metrology coordinate system with respect to the inkjet coordinate system, substrate 202 can be precisely located for topography measurement. In one embodiment, inkjet 407 can be used to overcome errors in precision substrate location and alignment, particularly, if inkjet 407 has been precisely located and there are substantial errors in loading substrate 202 on chuck 403 every time it is mounted. Inkjet 407 may be used to dispense drops (that are then also cured) on substrate 202 on an area that is substantially removed from the area that needs to have the tailored film deposited, such that the drops do not interfere with the PAINT process depositing the tailored film. These drops can be analyzed under the same DLM 408 which is used to identify the substrate notch 413, thereby giving the relative position and orientation of substrate 202. If such area is unavailable, the drops may be dispensed on a small secondary surface that is structurally connected to the substrate chuck such that it can be located accurately and repeatably with respect to substrate 202, and which is substantially at the same level as substrate 202. This approach can help overcome errors in precision substrate location and alignment.

In step 507, using the measured surface of the chucked substrate 202 with "$d_1$" and "$d_2$", a map between the substrate coordinate system and the metrology coordinate system is obtained with micron-scale precision.

This procedure allows for substrate 202 to be located with micron-scale precision between metrology tool 402 and inkjet 407. The position and orientation of inkjet 407 itself can be calibrated one-time by first locating ULM 405 through DLM 408 to establish a "zero" reference for stage 404. Then, an array/matrix of drops can be inkjetted and cured on a dummy substrate 202. This array/matrix of drops can then be examined under DLM 408. The location of each drop can be used to finely calibrate the location of each nozzle. Coarse positioning and orientation calibration can be done through drops at the center and the ends of the array or matrix. For this purpose of one-time calibration, the drops can be dispensed at a lower frequency or with lower stage speed. The inkjet height may also be reduced. These measures may help increase the precision of the location of the inkjetted drops, such that the dispensed drop locations match substantially with the ideal drop locations. In other words, errors in the drop location on substrate 202 that arise from the inkjet head operation as well as the synchronization of the inkjet head operation with stage motion will be reduced. If the drops do not provide sufficient precision because of variation in drop placement accuracy, ULM 405 can be used to locate the inkjet head and the best fit line of the nozzles. In one embodiment, ULM 405 images the inkjet nozzles to determine the best fit line. In this manner, a position on stage 404 can be identified in response to ULM 405 determining the best fit line. In one embodiment, such a position includes x, y and theta positions. The location and orientation of this line can then be available in the inkjet co-ordinate system. Usually, the stage precision is much better than inkjet drop placement accuracy. Hence, this approach can lead to higher precision in locating the inkjet and metrology tool.

Also, if metrology tool 402 cannot be located in-situ, the topography measurement of substrate 202 may be done offline. Ex-situ metrology may be done with the same or similar metrology tool fitted with the same/similar annular ring 401 having alignment marks. A DLM 408 can also be affixed to metrology tool 402 and the same or similar substrate process chuck can be mounted on an x-y-theta stage fitted with ULM 405. First, DLM 408 and ULM 405 can be aligned to correct for global chuck positioning errors. Thereafter, ULM 405 and annular plate 401 can be used to calibrate the offset between metrology tool 402 and DLM 408. Substrate 202 can then be measured on metrology tool 402. Alignment errors between metrology tool 402 and the chucked substrate 202 can be corrected by locating the notch/flat precisely under DLM 408 fixed to metrology tool 402. Using the calibrated offset between metrology tool 402 and DLM 408, the precise location of notch 413 (and consequently, the entire substrate 202) can be obtained as viewed on metrology tool 402. This procedure assumes that the lateral resolution of metrology tool 402 is not sufficient to locate notch 413 with micron-scale precision. If, however, the converse is true, this procedure may not be needed. Similarly, on the PAINT tool, ULM 405 on stage 404 and DLM 408 on bridge 406 are used to locate inkjet 407 and notch 413 on substrate 202, as described in the in-situ metrology procedure above. When combined with the ex-situ precise location of notch 413 on metrology tool 402, this gives the precise location of substrate 202 on the PAINT tool with respect to the ex-situ metrology tool.

In both the ex-situ and in-situ metrology setups, the annular alignment plate 401 fixed to metrology tool 402 is utilized. Hence, precise assembly of this plate 401 with metrology tool 402 may be required, necessitating the use of precision assembly techniques.

In one embodiment, the steps of method 500 are automated, such as via a program stored in memory 411 whose instructions are executed by a processor 412.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Separation of superstrate 204 and peeling it off substrate 202 is also an important aspect of the present invention. It is assumed that substrate 202 stays stationary and superstrate 204 is separated away from it. After UV-curing, superstrate 204 is separated from substrate 202 in PAINT by adjusting the bending profile of superstrate 204 to create a crack front from the edge to the center. In another embodiment, superstrate 204 can be coated with a thin film of a sacrificial material. Prior to the start of the peeling process, the sacrificial film can be removed from the edges of the superstrate-polymer-substrate sandwich by exposing superstrate 204 to an ambient environment that can sublimate the sacrificial film. Removal of the film creates a crack front, which can then be propagated using the appropriate superstrate bending profile. If at any time in the separation process, local peaks or valleys cause temporary cessation of the crack front, the above approach can be used to force open and propagate the crack front. Photochemical laser ablation may be used as a potential technique to achieve the above-described sublimation of a polymer film. This can be done by coating superstrate 204 with a thin film of a polymer that has a substantially different ablation threshold intensity and/or laser wavelength compared to that for the deposited film and the superstrate/substrate (204/202) materials. For example, if the deposited material were Poly(methyl methacrylate) (PMMA) or a comparable acrylate which is cured at a wavelength of 355 nm, the sacrificial film could be polyimide (PI), which has a laser ablation threshold of 40 mJ/cm$^2$ at a different wavelength of 248 nm. On the other hand, PMMA has a much higher threshold of 500 mJ/cm$^2$ at 248 nm. Hence, exposure to a low (~50 mJ/cm$^2$) dose of 248 nm laser would ablate the PI, but keep the deposited film (PMMA) intact. Superstrate 204 may then be treated as a consumable and discarded or re-processed to get the sacrificial film deposited again. The "R2R" configuration may provide additional benefits in allowing the above process to be automated with a given region of the R2R superstrate 204 used only once followed by re-processing or discarding the used superstrate 204.

Another approach could be the use of handles or flanges on superstrate 204. They could be mechanically held by the superstrate chuck 204, and then pulled to assist in peeling superstrate 204 off substrate 202. This could be in addition to the existing vacuum- and positive pressure-based profile control of superstrate 204 (or substrate 202) combined with vertical translation of superstrate 204 (or substrate 202) chuck.

Some representative materials that may be used as the deposited film include inkjettable compositions, such as an etch barrier solution, my-Cur from Microresist Technologies, Monomat® from Canon Nanotechnologies. Substrates 202 may also need to be pre-treated to tailor the wetting properties. Some materials that may be used for promoting adhesion between substrate 202 and the deposited film include ValMat® and Transpin® from Canon Nanotechnologies. Some substrate materials, such as polycarbonate, may not need to be pre-treated as they naturally have the desired wetting and adhesion characteristics. Materials that could be used to treat the surface of superstrate 204 for improving interfacial properties have been discussed above.

A discussion regarding the development of a thin-film lubrication model and corresponding re-design of the geometry of superstrate 204 is now deemed appropriate.

Fluid flow in domains that have much larger lateral length scales compared to height (thin films) can be solved using the lubrication approximation which assumes that the flow is predominantly parallel to the surface and the perpendicular pressure gradient is zero. Typically, this leads to a nonlinear model, which can be linearized for lower computational cost and better understanding of the process mechanics. Linearization leads to a characteristic process time scale obtained as:

$$\tau_{paint} = \frac{12\mu R^6}{D_{eff} h_0^3 \pi^6} \tag{1}$$

$$D_{eff} \propto \left[ \frac{Eb^2}{(1-v^2)} \right] \tag{2}$$

where $h_0$ is the mean film thickness, R is a horizontal length scale, typically the radius of the deposited area, a and b are exponents depending on the exact nature of the process and $D_{eff}$ is the effective bending rigidity of superstrate 204 (if substrate 202 was rigid, and vice-versa), which depends on the Young's modulus, E, superstrate thickness, b, and Poisson's ratio, v. If substrate 202 was also flexible, the effective bending rigidity would involve a combination of the two. In general, a larger value of $\tau_{paint}$ is desirable as it provides a longer time to capture the pre-equilibrium transients. From Eq. 1, a smaller $D_{eff}$ appears to lead to a higher $\tau_{paint}$. Therefore, a suitable process condition (which implies high values of $\tau_{paint}$) requires low superstrate stiffness.

This term ($\tau_{paint}$) can be used to define a non-dimensional process time (t*) as the ratio between the actual process fluid spread time ($\tau$) and $\tau_{paint}$, as $$t^* = \frac{t}{\tau_{paint}} \tag{3}$$

The aim is to minimize this re-distribution such that the final film thickness has a strong correlation with the initial material distribution so that the "programmable" nature of PAINT can be achieved by the pre-defined locations and volumes of the inkjetted fluid drops. In other words, this dynamic model reveals the fact that it is imperative to capture a pre-equilibrium transient state in the evolution of the sandwich because the equilibrium state allows for only one possible steady state solution that is typically undesirable and is corrupted by the parasitic topography of substrate 102 (not shown in FIG. 2). This defeats the purpose of the programmable deposition of thin films. This concept of "capturing pre-equilibrium transients that substantially correlates with the inkjetted fluid drops" while minimizing the effects of substrate and superstrate topography at different spatial length scales is central to the PAINT process.

From the standpoint of delaying equilibrium, it is desirable to make superstrate 204 as thin as possible. However, making superstrate 204 arbitrarily thin is not feasible as discussed above in the context of optimal flexibility. In addition, thin superstrates 204 may be difficult to handle for automation, loading, etc.

In the field of planarization, when high-frequency spatial topography, such as nanoscale patterns, are present, the appropriate definition of mean film thickness, $h_0$, becomes important. This is because the need here is to overcome this high-frequency topography, while minimizing any fluid distribution because of mid and low-spatial frequency topography. Hence, the mean film thickness can be chosen as an appropriate average between a local maximum and minimum film thickness value. For example, the minimum film thickness can be the residual layer thickness while the maximum film thickness can be slightly more than the sum of the residual layer thickness and the maximum feature height. An appropriate average can be a statistical measure of central tendency, such as an area-weighted mean, or even the most conservative bound, which in this case would be the local maximum film thickness.

As mentioned earlier, first order properties of the model can be obtained analytically by conducting a linear analysis with $\tilde{h}(\tilde{r},\tilde{t})=1+\tilde{\epsilon}\,(\tilde{r},\tilde{t})$ where $\|\tilde{\epsilon}\|\ll 1$, where r is in the nominal substrate surface coordinate system. This leverages work done for PAINT. It is important to factor the presence of substantial substrate topography to not obfuscate model linearization. However, establishing a proper substrate coordinate system that accounts for the substrate topography is necessary to ensure that the linearization yields feasible results. The linearized model can be solved analytically thereby drastically reducing computational complexity and allowing for a key aspect of PAINT to be solved: optimal locations and volumes of fluid drops for a desired film thickness profile. In one embodiment, the desired film thickness is tailored to have one or more of the following properties: optical, photonic, wetting, mechanical, structural, thermal, magnetic, electronic, biological and chemical.

In addition to the inverse optimization for an optimum film thickness profile based on process mechanics, an important aspect of the PAINT process involves a wrapped functional optimization scheme. The purpose of the functional optimization scheme is to correlate the desired film thickness with desired functional performance of the process and substrate 202. For example, in semiconductor planarization, it may be important to ensure that the planarizing film eventually does not become anti-reflective or has some other desired optical properties. It may also be important to ensure that the thickness of the planarizing film does not interfere with subsequent etch-back. This is because the planarizing film extends beyond the maximum feature height as shown in FIG. 6.

Figure 6:
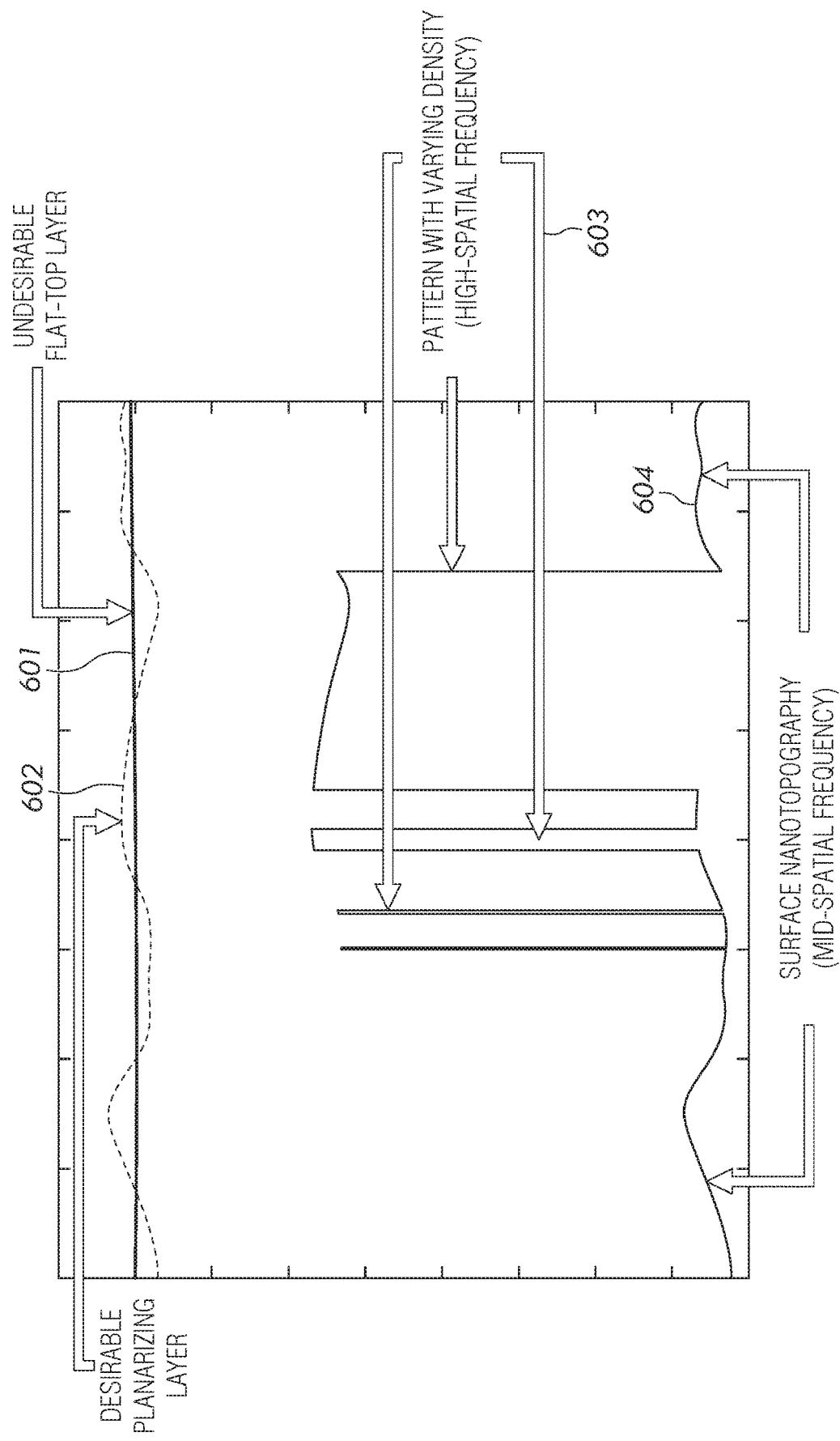
FIG. 6 illustrates the planarization of a pattern in the presence of surface nanotopography in accordance with an embodiment of the present invention.

FIG. 6 illustrates the planarization of a pattern (e.g., microscale or nanoscale pattern) in the presence of surface nanotopography in accordance with an embodiment of the present invention.

Referring to FIG. 6, a flat-top layer 601 is undesirable as it includes the signature of surface nanotopography. The planarizing layer 602 is desirable as it overcomes the topography of the pattern, but conforms to the substrate nanotopography. Prior to planarization, the pattern (e.g., microscale or nanoscale pattern) may be spin-coated with another material (not shown), which may overcome some of the high-frequency patterns 603, but may introduce a mid- and low-spatial frequency parasitic signature 604.

The computational cost of this higher-level constraint may slow down the inverse optimization scheme, and based on how high the computational cost is, an approach can be taken where optical performance calculations are undertaken intermittently, at a frequency that is not computationally cost-prohibitive, rather than for each sub-optimal film thickness profile obtained while performing the optimization.

Another novel aspect of the process is the relative ease with which multi-layer films—either of the same material or of different materials—having the desired profiles can be deposited. From the thin film model, it is evident that keeping the mean film thickness ($h_0$) small helps in keeping the time scale high which is desirable for capturing non-equilibrium transients (Eq. 2). Hence, it can be problematic to deposit thick uniform films or films with large thickness variations in a single step. This can be alleviated by decomposing the desired profile into a sum of smaller increments, which ensures that the time scale is desirably high for each unit step, and thus, preserves the accuracy established for a single-step process.

Where inkjetting is used for depositing, a multi-step process can be extended to the deposition of multi-material stacks by using different inkjettable materials, such that each layer in the stack has a prescribed profile. Potential different materials include Monomat 385, Monomat 353 and Silmat resists from Molecular Imprints, Inc. as well as mr-UV-Cur06, mr-UVCur21 and mr-NIL 6000E resists from Micro Resist Technologies. This enables the deposition of films with material as well as thickness gradients in its depth direction, a feature that is not easily available in the current state-of-the-art. This process could be achieved by having a set of multi jets with distinct materials in each of the multi-jets. The entire process could be achieved without the substrate being removed from the tool between the various individual PAINT steps.

Figure 7:
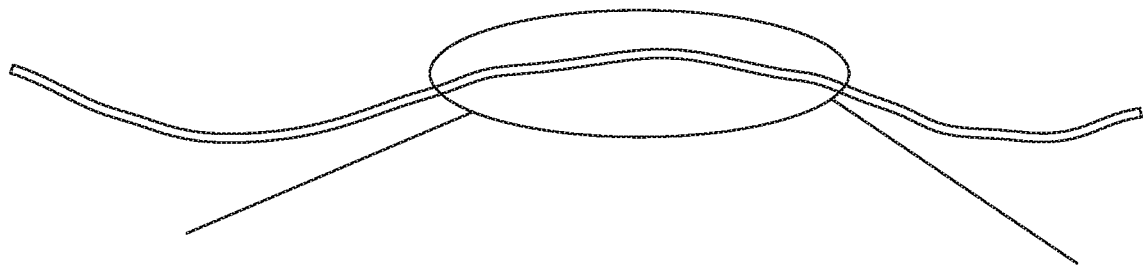
FIG. 7 illustrates the different scales of surface topography in accordance with an embodiment of the present invention.
Figure 7:
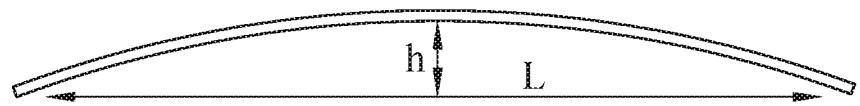
Figure 7:
Figure 7:

The topography of substrate 202 and the superstrate 204 can introduce parasitic errors during planarization and polishing as shown in FIG. 7. FIG. 7 illustrates the different scales of surface topography in accordance with an embodiment of the present invention. As shown in FIG. 7, the topography of any surface can be classified in three broad categories, depending upon the amplitude and spatial wavelength of the same: (i) nominal shape (low spatial frequency), (ii) nanotopography (mid-spatial frequency) and (iii) roughness or nanoscale features (high-spatial frequency). The nominal shape is given by the largest spatial wavelengths, typically >20 mm with height variations typically from 0-10 mm. For spatial length scales of ~0.2-20 mm, height variations, usually ~100 nm-1 micron, at this spatial wavelength range are classified as nanotopography. Roughness is classified for lower spatial wavelengths with much smaller height variations. The presence of nanoscale patterns can further aggravate the high-spatial frequency topography, normally represented by roughness only. However, compensating for topography at given spatial frequency scales while minimizing any parasitic influence of topography at other scales (as seen in semiconductor planarization and polishing) can be challenging. This is where the model-based design of the PAINT process can be useful, as it adaptively caters to the compensation of topography at different length scales, while minimizing the influence of parasitics caused by overall surface topography.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An alignment system, comprising:
a plate with alignment marks attached to a metrology tool;

a bridge having an inkjet, a downward looking microscope and a superstrate chuck affixed to said bridge, wherein a superstrate is affixed to said superstrate chuck;

a stage fitted with an upward looking microscope; and a substrate with an identifiable feature is chucked and mounted on said stage.

2. The alignment system as recited in claim 1, wherein a first position on said stage is identified for optimal placement of said downward looking microscope and said upward looking microscope in response to alignment marks on said downward looking microscope and said upward looking microscope being aligned.

3. The alignment system as recited in claim 2, wherein said alignment marks on said downward looking microscope and said upward looking microscope comprise one or more of the following: box-in-box and cross-in-cross type features.

4. The alignment system as recited in claim 2, wherein a second position on said stage is identified in response to said upward looking microscope on said stage being aligned with said alignment marks on said plate.

5. The alignment system as recited in claim 4, wherein a relative position of a metrology coordinate system with an inkjet coordinate system is obtained by a difference between said first and second positions.

6. The alignment system as recited in claim 4, wherein a surface of said chucked substrate is measured.

7. The alignment system as recited in claim 6, wherein a transformation between a substrate coordinate system and a metrology coordinate system is obtained using said measured surface of said chucked substrate with said first and second positions.

8. The alignment system as recited in claim 4, wherein said first and second positions comprise x, y and theta positions.

9. The alignment system as recited in claim 1, wherein said upward looking microscope on said stage is used to image inkjet nozzles.

10. The alignment system as recited in claim 9, wherein a precise location and orientation of said inkjet nozzles are identified in a coordinate system attached to said inkjet by using said image of said inkjet nozzles as seen by said upward looking microscope.

11. The alignment system as recited in claim 1, wherein said identifiable feature comprises one or more of the following: a flat, a notch and a pre-existing alignment mark.

12. The alignment system as recited in claim 1, wherein said stage moves said substrate to said metrology tool and moves said substrate to said superstrate chuck.

13. The alignment system in claim 1, wherein said stage fitted with said upward looking microscope moves said substrate to said superstrate chuck, wherein a second stage moves said substrate to said metrology tool, wherein said stage fitted with said upward looking microscope is distinct from said second stage.

* * * * *